United States Patent
Kim et al.

(10) Patent No.: US 9,087,697 B2
(45) Date of Patent: Jul. 21, 2015

(54) METHOD FOR CRYSTALLIZING A SILICON SUBSTRATE

(71) Applicants: Sung-Ho Kim, Yongin (KR); Min-Hwan Choi, Yongin (KR); Min-Ji Baek, Yongin (KR); Sang-Kyung Lee, Yongin (KR); Sang-Ho Jeon, Yongin (KR); Jong-Moo Huh, Yongin (KR)

(72) Inventors: Sung-Ho Kim, Yongin (KR); Min-Hwan Choi, Yongin (KR); Min-Ji Baek, Yongin (KR); Sang-Kyung Lee, Yongin (KR); Sang-Ho Jeon, Yongin (KR); Jong-Moo Huh, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 13/890,476

(22) Filed: May 9, 2013

(65) Prior Publication Data
US 2014/0120704 A1 May 1, 2014

(30) Foreign Application Priority Data
Oct. 31, 2012 (KR) .................. 10-2012-0121908

(51) Int. Cl.
*H01L 21/02* (2006.01)
*H01L 21/66* (2006.01)

(52) U.S. Cl.
CPC .... *H01L 21/02686* (2013.01); *H01L 21/02532* (2013.01); *H01L 22/12* (2013.01); *H01L 22/20* (2013.01)

(58) Field of Classification Search
CPC .............. H01L 21/02686; H01L 21/02532; H01L 22/12; H01L 22/20
USPC .............. 438/487, 166, 7, 14, 16, 486, 488; 257/506, E21.527, E21.134, E21.133, 257/E21.347, E27.111, E29.293, E21.568, 257/E27.112, E29.282, E31.045; 356/369, 356/237.5, 30, 264, 445, 632; 250/205
See application file for complete search history.

(56) References Cited

U.S. PATENT DOCUMENTS 3,817,628 A * 6/1974 Adams .................. 356/448
5,372,836 A * 12/1994 Imahashi et al. ............ 438/5
(Continued)

FOREIGN PATENT DOCUMENTS

EP          451329 A2 * 10/1991  ............... G03F 7/20
KR   10-2005-0004081 A    1/2005
(Continued)

OTHER PUBLICATIONS

Chelikowsky et al., Nonlocal pseudopotential calculations for the electronic structure of eleven diamond and zinc-blended semiconductors, Physical Review B 14, pp. 556-582 (1976).*
(Continued)

*Primary Examiner* — Marvin Payen
*Assistant Examiner* — Victor Barzykin
(74) *Attorney, Agent, or Firm* — Lee & Morse, P.C.

(57) ABSTRACT

A method for crystallizing a silicon substrate includes manufacturing a crystallized silicon test substrate that is crystallized by scanning excimer laser annealing beams with different energy densities on respective areas of an amorphous silicon test substrate, irradiating a surface of the crystallized silicon test substrate using a light source, and measuring reflectivity corresponding to the respective areas of the crystallized silicon test substrate in a visible light wavelength range, extracting average reflectivities of the respective areas of the crystallized silicon test substrate in wavelength ranges corresponding to respective colors, calculating an optimum energy density (OPED) index per energy density by using a value acquired by subtracting average reflectivity of red-based colors from average reflectivity of blue-based colors, selecting an optimal energy density, and crystallizing an amorphous silicon substrate using the optimal energy density.

6 Claims, 7 Drawing Sheets

(56) References Cited

U.S. PATENT DOCUMENTS

| | | | |
|---|---|---|---|
| 5,409,538 A * | 4/1995 | Nakayama et al. | 118/688 |
| 5,747,201 A * | 5/1998 | Nakayama et al. | 430/30 |
| 6,169,013 B1 * | 1/2001 | Voutsas | 438/485 |
| 6,218,198 B1 * | 4/2001 | Imao et al. | 438/7 |
| 6,426,791 B2 * | 7/2002 | Imao et al. | 356/30 |
| 6,700,663 B1 * | 3/2004 | Lin | 356/369 |
| 6,922,243 B2 * | 7/2005 | Lin et al. | 356/369 |
| 7,125,761 B2 * | 10/2006 | Tanaka | 438/166 |
| 7,247,813 B2 * | 7/2007 | Jyumonji et al. | 219/121.83 |
| 7,307,283 B2 * | 12/2007 | Yoshimoto | 257/72 |
| 7,405,141 B2 * | 7/2008 | Jyumonji et al. | 438/487 |
| 8,346,497 B2 * | 1/2013 | Miyairi et al. | 702/117 |
| 8,377,804 B2 * | 2/2013 | Momo et al. | 438/487 |
| 2001/0017695 A1 * | 8/2001 | Imao et al. | 356/237.5 |
| 2004/0254769 A1 * | 12/2004 | Miyairi et al. | 702/189 |
| 2005/0002016 A1 * | 1/2005 | Tsao | 356/30 |
| 2010/0084734 A1 * | 4/2010 | Momo et al. | 257/506 |

FOREIGN PATENT DOCUMENTS

| | | |
|---|---|---|
| KR | 10-2005-0066572 A | 6/2005 |
| KR | 10-2007-0115082 A | 12/2007 |

OTHER PUBLICATIONS

Sameshima et al., XeCl Excimer laser annealing used in the fabrication of poly-Si TFT's, Electron Device Lett., 7, pp. 276-278 (1986).*

* cited by examiner

US 9,087,697 B2

METHOD FOR CRYSTALLIZING A SILICON SUBSTRATE

CROSS-REFERENCE TO RELATED APPLICATION

This application claims priority to and the benefit of Korean Patent Application No. 10-2012-0121908 filed in the Korean Intellectual Property Office on Oct. 31, 2012, and entitled: "METHOD FOR CRYSTALLIZING A SILICON SUBSTRATE," the entire contents of which are incorporated herein by reference.

BACKGROUND

1. Field

Embodiments relate to a method for crystallizing a silicon substrate using laser beams.

2. Description of the Related Art

In order to form an active layer used for a thin film transistor (TFT) with a polysilicon thin film, a method for depositing intrinsic amorphous silicon on an insulation substrate through a plasma enhanced chemical vapor deposition (PECVD) method or a low pressure chemical vapor deposition (LPCVD) method and crystallizing it is used.

The crystallization method includes: an excimer laser annealing (ELA) method for instantly irradiating excimer laser beams that are high-power pulse laser beams to apply heat and crystallizing amorphous silicon; a solid phase crystallization (SPC) method for crystallizing amorphous silicon in a reactor by heating the reactor; a sequential lateral solidification (SLS) method for using energy in a complete melting band; and a metal induced crystallization (MIC) method for selectively depositing metal on an amorphous silicon layer, applying an electric field, and inducing crystallization with the metal as a seed.

The above information disclosed in this Background section is only for enhancement of understanding of the background of the invention and therefore it may contain information that does not form the prior art that is already known in this country to a person of ordinary skill in the art.

SUMMARY

Embodiments are directed to a method for crystallizing a silicon substrate, the method including manufacturing a crystallized silicon test substrate that is crystallized by scanning excimer laser annealing beams with different energy densities on respective areas of an amorphous silicon test substrate, irradiating a surface of the crystallized silicon test substrate using a light source in a visible light wavelength range, and measuring reflectivity corresponding to the respective areas of the crystallized silicon test substrate in the visible light wavelength range, extracting average reflectivities of the respective areas of the crystallized silicon test substrate in a plurality of wavelength ranges corresponding to respective colors, calculating an optimum energy density (OPED) index per energy density by using a value that is acquired by subtracting average reflectivity of red-based colors from average reflectivity of blue-based colors for the respective areas from among the extracted average reflectivities for the respective colors, selecting an optimal energy density by comparing the calculated OPED indexes for respective energy densities, and crystallizing an amorphous silicon substrate using the optimal energy density.

The surface of the crystallized silicon test substrate may be irradiated with a visible ray in a wavelength range from 450 nm to 750 nm as a light source.

A wavelength range of the blue-based colors may be 450 nm to 495 nm, and a wavelength range of the red-based colors may be 496 nm to 750 nm.

The blue-based colors may include blue having a wavelength range from 450 nm to 475 nm and cyan having a wavelength range from 476 nm to 495 nm.

The red-based colors may include green having a wavelength range from 496 nm to 560 nm, yellow having a wavelength range from 561 nm to 590 nm, orange having a wavelength range from 591 nm to 620 nm, and red having a wavelength range from 621 nm to 750 nm.

The calculating of an OPED index may include calculating the OPED per energy density by applying a weight to average reflectivity per color.

In subtracting the average reflectivity of red-based colors from the average reflectivity of blue-based colors, a weight value that is from 1 to 10 may be applied to blue and cyan, and a weight value that is from 0.1 to 1 may be applied to green, yellow, orange, and red.

The optimal energy density may represent an energy density that is the maximum value from among the calculated OPED indexes per energy density.

BRIEF DESCRIPTION OF THE DRAWINGS

Features will become apparent to those of skill in the art by describing in detail example embodiments with reference to the attached drawings in which.

DETAILED DESCRIPTION

Figure 1:
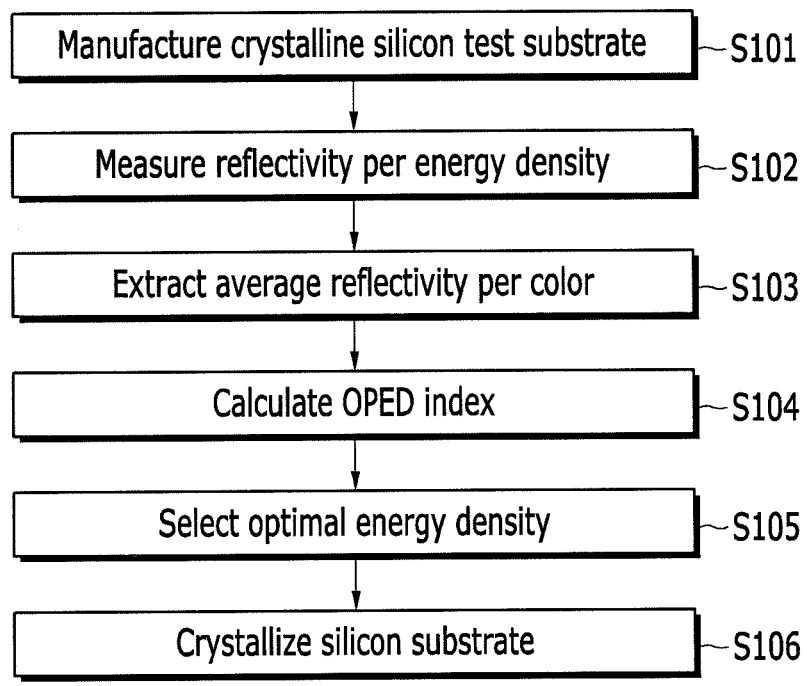
FIG. 1 shows a flowchart of a method for crystallizing a silicon substrate according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

Further, in example embodiments, since like reference numerals designate like elements having the same configuration, a first example embodiment is representatively described, and in other example embodiments, only a configuration different from the first example embodiment may be described.

The drawings are schematic and are not proportionally scaled. Relative scales and ratios in the drawings are enlarged or reduced for the purpose of accuracy and convenience, and the scales are arbitrary such that the embodiments are not limited thereto. In addition, like reference numerals designate like structures, elements, or parts throughout the specification. It will be understood that when an element is referred to as being "on" another element, it can be directly on another element or intervening elements may be present therebetween.

Drawing views represent ideal example embodiments in detail. Resultantly, various modifications of diagrams are expected. Accordingly, the example embodiments are not limited to specific shapes of shown regions, and for example, also include modifications of the shape by manufacturing.

A method for crystallizing a silicon substrate according to an example embodiment will now be described with reference to FIG. 1 to FIG. 5.

Figure 2:
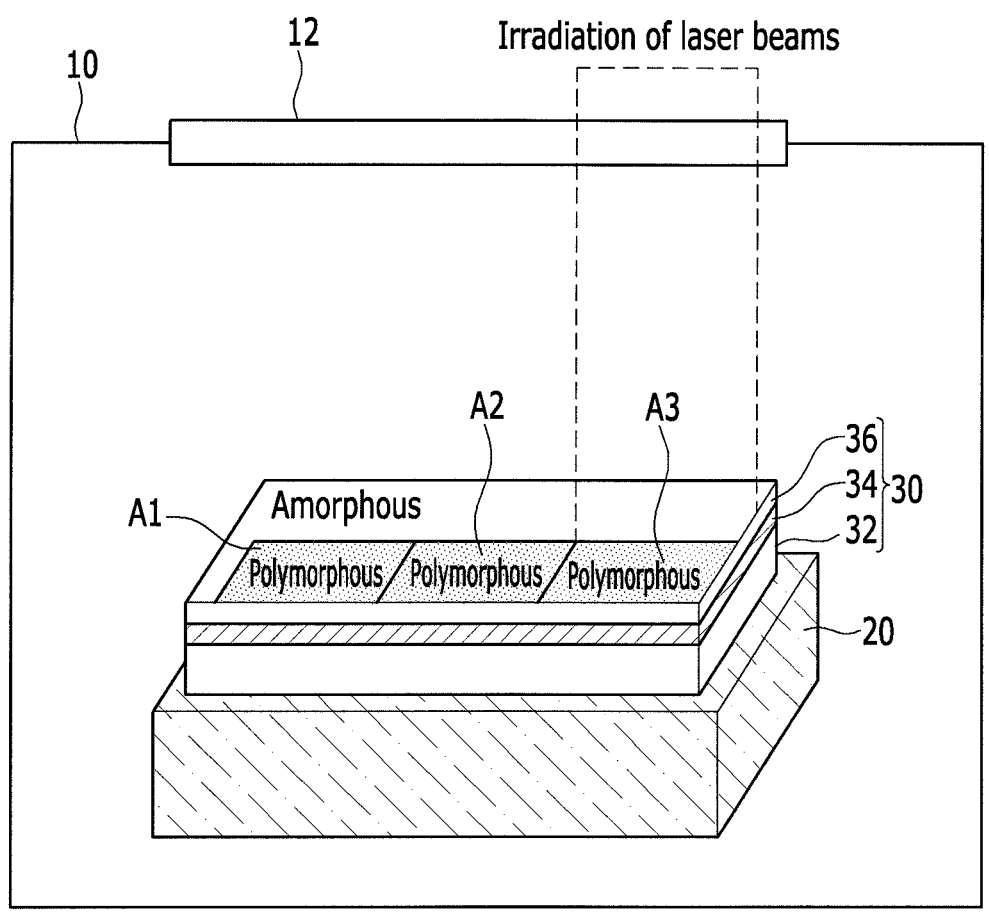
FIG. 2 shows a schematic diagram of a method for manufacturing a crystallized silicon test substrate according to an example embodiment.

FIG. 1 shows a flowchart of a method for crystallizing a silicon substrate according to an example embodiment, and FIG. 2 shows a schematic diagram of a method for manufacturing a crystallized silicon test substrate according to an example embodiment.

Referring to FIG. 1 and FIG. 2, an amorphous silicon (Si) test substrate 30 that is partitioned into a plurality of regions is provided.

The test substrate 30 is provided on a stage 20 for supporting the test substrate 30 and allowing the test substrate 30 to move in a predetermined direction in a vacuum chamber 10. The test substrate 30 includes a base substrate 32, a buffer layer 34 provided on the base substrate, and a silicon layer 36 provided on the buffer layer 34. The vacuum chamber 10 includes a laser irradiation window 12 for transmitting laser beams into the chamber, while the vacuum state is maintained, and onto the silicon layer 36.

The silicon layer 36 can be made of a silicon material that is deposited in an amorphous state and is poly-crystallized through laser energy.

The laser beams with different energy densities are irradiated into the respective areas (A1, A2, A3, ... ) of the silicon layer 36 of the test substrate 30 to sequentially manufacture a polycrystalline silicon layer (S101) (i.e., crystallized silicon test substrate 30).

For the laser crystallization method, an excimer laser annealing (ELA) beam scanning method for instantly irradiating excimer laser beams (high-power pulse laser beams) on the substrate to apply heat and perform crystallization can be used. In this instance, the energy density can cover the substantial range from 425 mJ to 476 mJ (all references herein to values in "mJ" are understood to be based on a same area of irradiation and are normalized for convenience of description).

Figure 3:
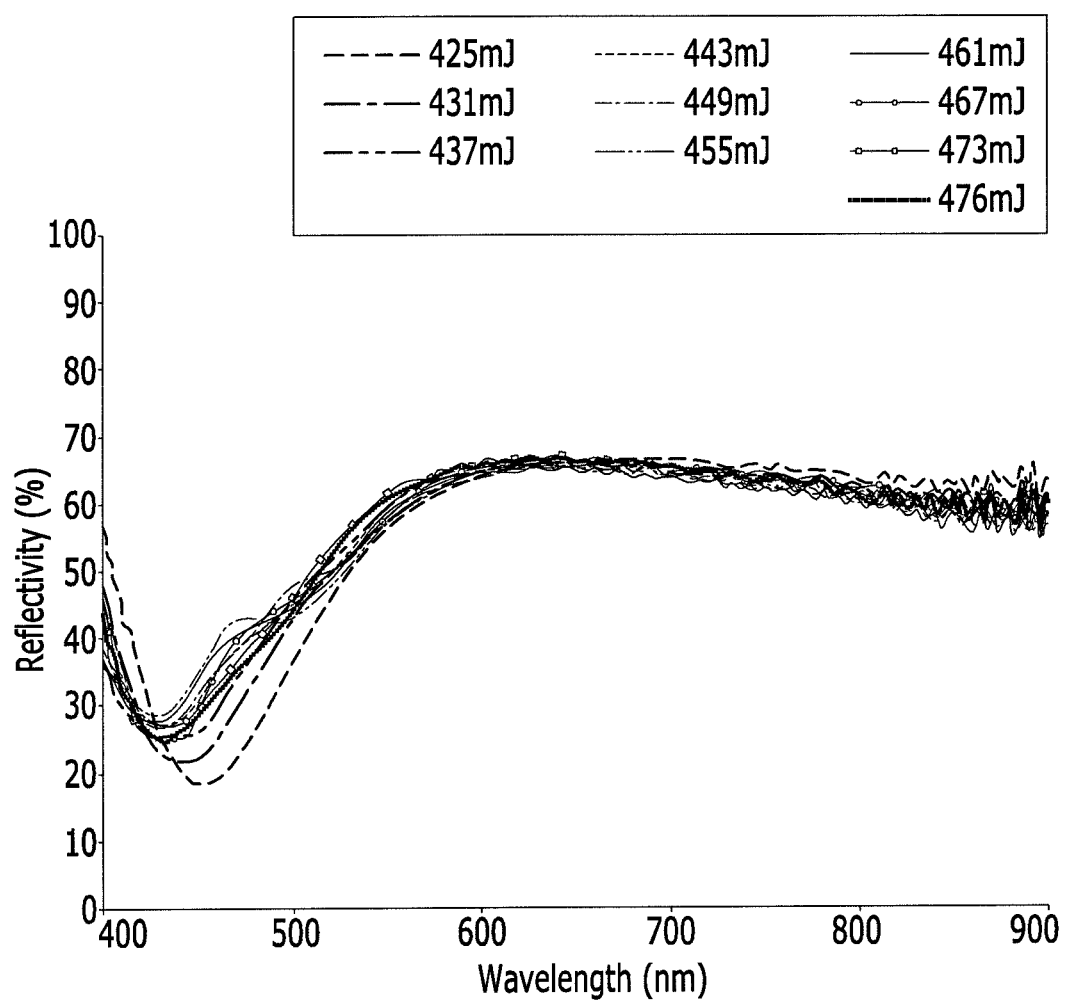
FIG. 3 shows a graph that is acquired by measuring reflectivity per energy density corresponding to a substrate region on a surface of a crystallized silicon test substrate according to an example embodiment.

Subsequently, a light source (not shown) having a visible light wavelength range provides light that is irradiated to the entire surface of the crystallized silicon test substrate 30. The light can have a substantial wavelength range from 450 nm to 750 nm. Reflectivity of the light irradiated on the surface of the silicon test substrate 30 is measured for the respective areas (A1, A2, A3, ... ) of the test substrate 30 (S102). As shown in FIG. 3, reflectivity per energy density (for respective areas) in the wavelength range from, e.g., 400 nm to 900 nm is measured (S102) and can be shown with a graph.

Figure 4:
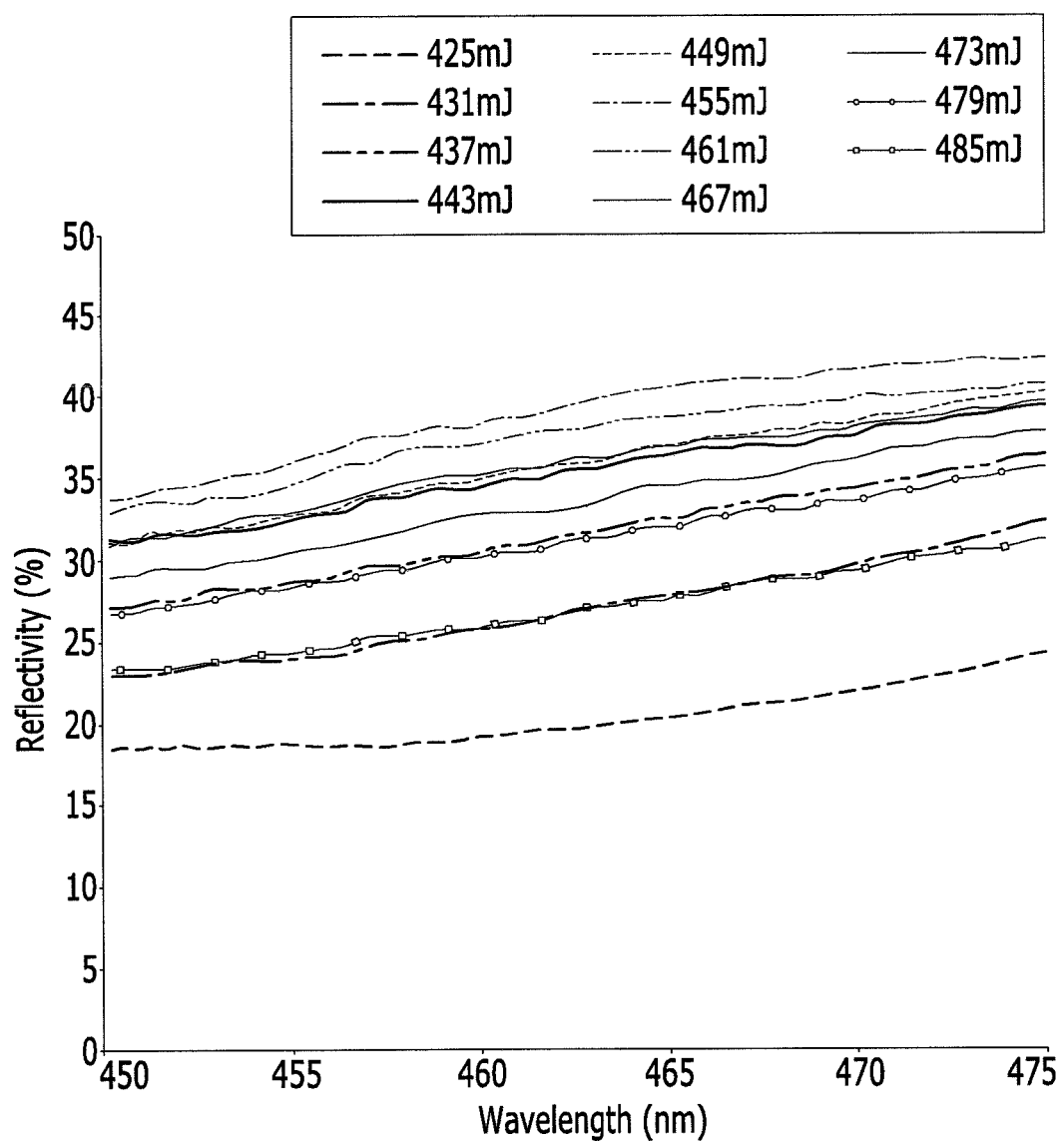
FIG. 4 shows a graph that is acquired by extracting average reflectivity per energy density in a wavelength range that corresponds to blue according to an example embodiment.

As shown in FIG. 4, reflectivity that corresponds to the respective areas of the test substrate 30 in the plurality of wavelength ranges is partitioned by colors (S103). FIG. 4 shows a graph that is acquired by extracting average reflectivity per energy density in a wavelength range that corresponds to blue according to an example embodiment in the graph of FIG. 2. As shown in FIG. 4, the wavelength range is 450 nm to 475 nm and the color corresponding to the range is blue, so reflectivity per energy density (for respective colors) can be extracted from blue.

Thereafter, average reflectivity per energy density of the respective substrate areas in specific wavelength ranges corresponding to specific colors is extracted (S103). For example, reflectivity per specific energy density of cyan corresponding to the wavelength range of 476 nm to 495 nm, green corresponding to the wavelength range of 496 nm to 560 nm, yellow corresponding to the wavelength range of 561 nm to 590 nm, orange corresponding to the wavelength range of 591 nm to 620 nm, and red corresponding to the wavelength range of 621 nm to 750 nm are extracted to illustrate the graph that is shown in FIG. 4.

Figure 5:
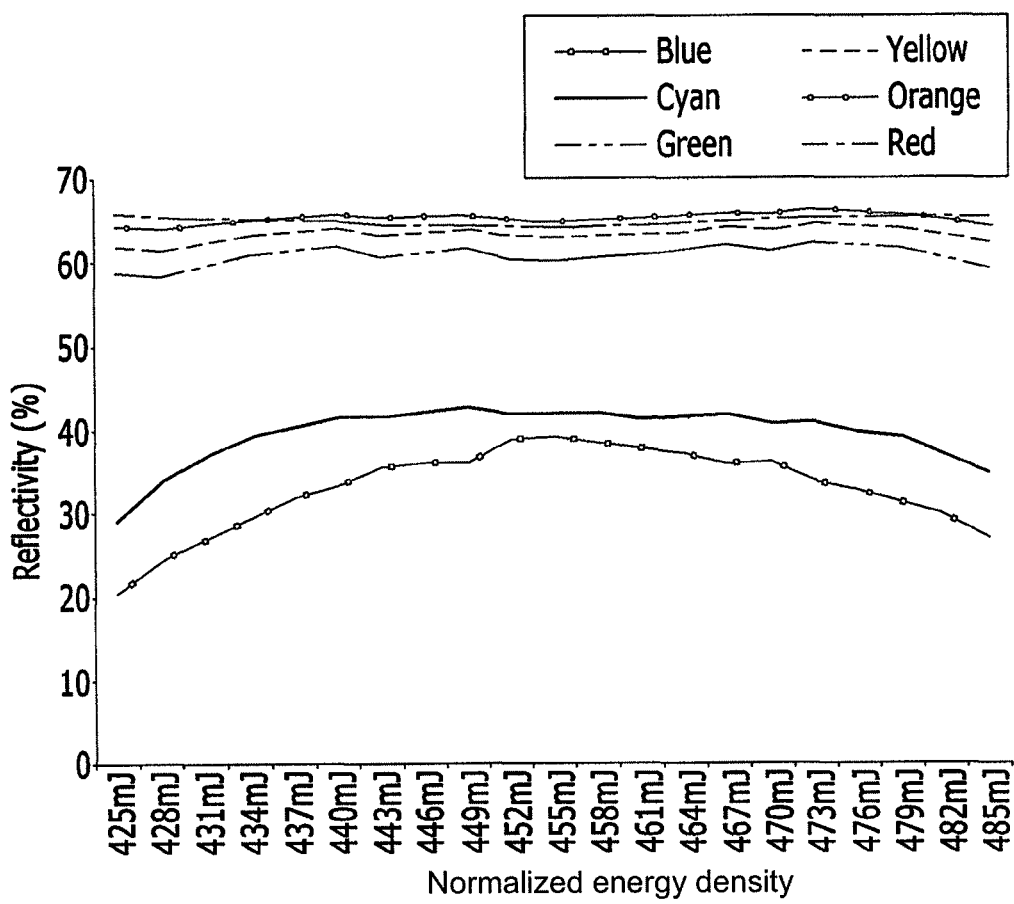
FIG. 5 shows a graph that is acquired by extracting average reflectivity per energy density in a plurality of wavelength ranges that are partitioned by colors according to an example embodiment.

FIG. 5 shows a graph that is acquired by extracting average reflectivity per energy density in a plurality of wavelength ranges that are partitioned by colors according to an example embodiment. For example, referring to FIG. 4, the average reflectivity on the line of the energy density of 425 mJ that is shown at the bottom is substantially 20%, and the average reflectivity on the line of the energy density of 428 mJ that is above the bottom line is substantially 23%. Therefore, the line for the average reflectivity of blue with the energy density from 425 mJ to 485 mJ is indicated with the bottom line of FIG. 5.

According to the above-described method, the average reflectivity of cyan, green, yellow, orange, and red with the energy density from 425 mJ to 485 mJ is shown with lines as shown by the graph of FIG. 5.

An optimum energy density (OPED) index per energy density can be calculated with a value that is acquired by subtracting the average reflectivity from a blue-based color to a red-based color from among the extracted average reflectivity for the respective colors for the respective areas of the test substrate (S104).

In the present embodiment, the blue-based color includes blue with the wavelength range from 450 nm to 475 nm and cyan with the wavelength range from 476 nm to 495 nm. The red-based color includes green with the wavelength range from 496 nm to 560 nm, yellow with the wavelength range from 561 nm to 590 nm, orange with the wavelength range from 591 nm to 620 nm, and red with the wavelength range from 621 nm to 750 nm.

Figure 6:
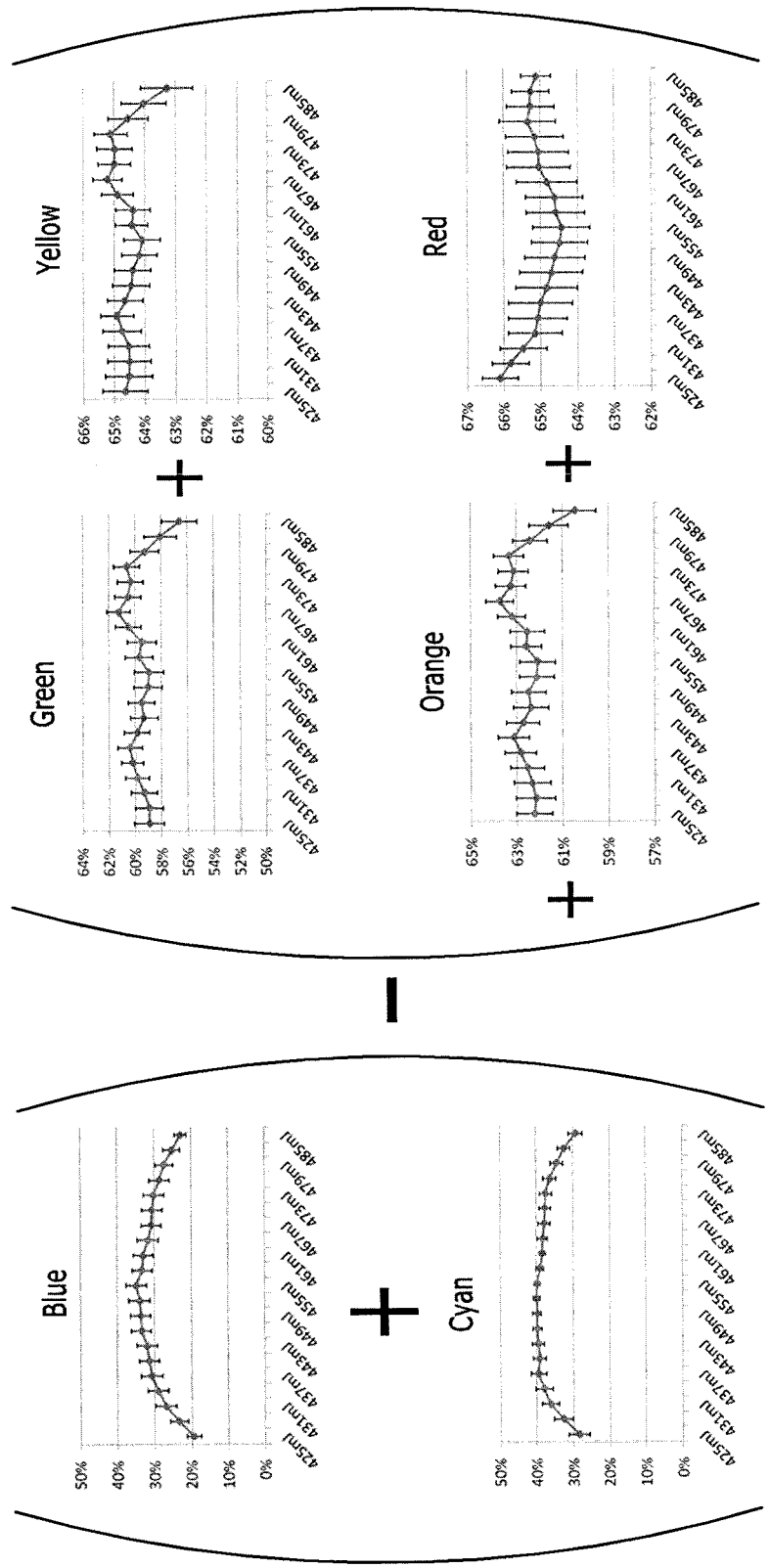
FIG. 6 shows a schematic view for calculating an OPED index from average reflectivity per energy density for respective colors according to an example embodiment.

FIG. 6 shows a schematic view for calculating an OPED index from average reflectivity per energy density for respective colors according to an example embodiment.

As shown in FIG. 6, the OPED index for the corresponding energy density is acquired by adding the average reflectivity of blue and the average reflectivity of cyan for respective energy densities, and subtracting the average reflectivity of green, yellow, orange, and red from the corresponding energy density, as expressed in Equation 1.

OPED index=(average reflectivity for a specific energy density extracted from blue-based wavelength range)−(average reflectivity for a specific energy density extracted from red-based wavelength range)  (Equation 1)

Figure 7:
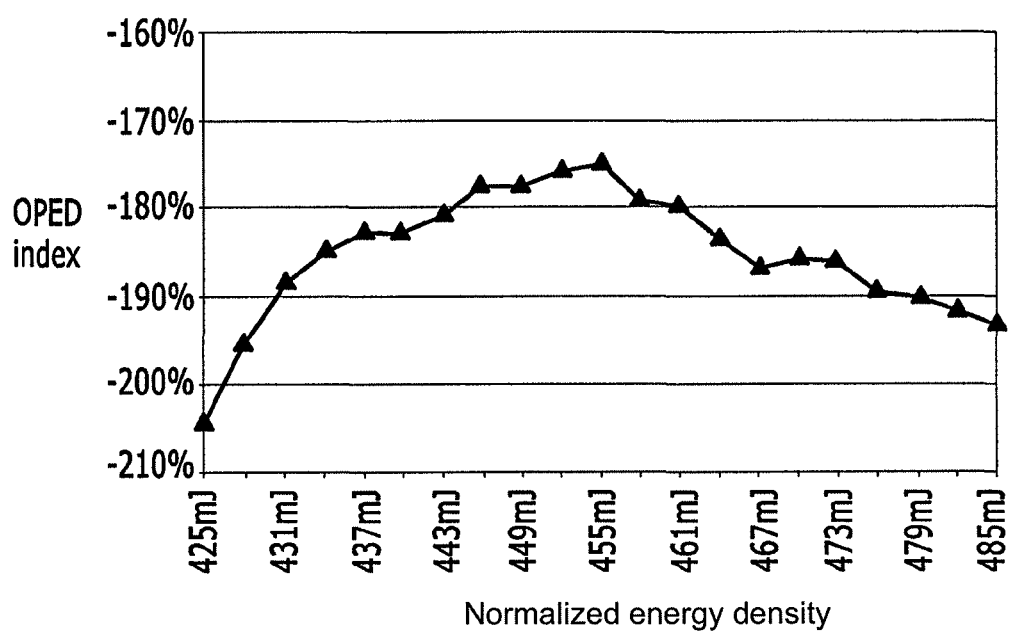
FIG. 7 is a graph showing an OPED index that is calculated for each energy density.

FIG. 7 shows a graph for showing an OPED index that is calculated for each energy density, i.e., FIG. 7 shows a graph for indicating the OPED index that is calculated from the average reflectivity of respective colors in the range of the energy density from 425 mJ to 485 mJ by using lines.

As shown in FIG. 7, when the OPED index is calculated from the average reflectivity of respective colors from the energy density of 425 mJ, the OPED index becomes substantially −205%, and when the OPED index is calculated from the average reflectivity of respective colors from the energy density of 485 mJ, the OPED index becomes substantially −194%.

When the OPED indexes for the respective energy densities are calculated, the OPED indexes for the specific energy densities (respective areas) have a trend, e.g., as shown in FIG. 7, and the energy density for indicating the OPED index of a maximum value is selected as an optimal energy density when the silicon substrate is crystallized (S105). Thus, as the energy density for the case in which a difference between a sum of average reflectivity of blue and cyan and a sum of average reflectivity of green, yellow, orange, and red becomes less, it can be selected as the optimal energy density. Blue and cyan are the most visible for the eyes of the user, so when the reflectivity of blue and cyan becomes greater, it shows that the substrate is smoothly crystallized, so the energy density for maximizing the OPED index becomes the optimal energy density.

According to another example embodiment, the calculating of the OPED index in S104 includes calculating an OPED index per energy density by applying a product of the average reflectivity for respective colors and a weight value, which is expressed in Equation 2.

$$\text{OPED index} = [(AR_b \times A) + (AR_c \times B)] - [(AR_g \times C) + (AR_y \times D) + (AR_o \times E) + (AR_r \times F)]$$

(In Equation 2, $AR_b$ is average reflectivity of blue, $AR_c$ is average reflectivity of cyan, $AR_g$ is average reflectivity of green, $AR_y$ is average reflectivity of yellow, $AR_o$ is average reflectivity of orange, and $AR_r$ is average reflectivity of red).

In this instance, A and B are weight values that are from 1 to 10, and C, D, E, and F are weight values that are from 0.1 to 1.

In the present embodiment, the average reflectivity of respective colors of the OPED index is multiplied by a corresponding weight value so that reflectivity values of blue and cyan that provide excellent visibility are extended by multiplying a weight value that is greater than 1 thereto, and reflectivity values of green, yellow, orange, and red that provide relatively inferior visibility are reduced by multiplying a weight value that is less than 1 thereto, and as a result, the difference between the blue-based extended reflectivity values and the red-based reduced reflectivity values becomes greater and the OPED index per energy density is clearly shown in the OPED index graph.

Accordingly, the OPED index is calculated from the average reflectivity in the specific energy densities for respective colors and the OPED indexes are compared to select the energy density with the maximum OPED index as the optimal energy density value. Thus, in the laser crystallization method for the silicon substrate, the appropriate energy is selected by using the objective index such as the OPED index other than the existing visual inspection, thereby eliminating the user deviation caused by visual inspection, and quickly and accurately selecting energy. Therefore, an amorphous silicon substrate may be crystallized and mass-produced using the optimal energy density that is selected according to the above-described method (S106).

By way of summation and review, the ELA method transmits strong energy with a short wavelength ($\lambda = 0.3$ μm) as a pulse through a silicon layer (which may be, e.g., 300 to 800 μm thick) so as to melt the silicon layer so fast crystallization is possible and a crystallization property is excellent. This method may thus improve mobility of an element and provide for excellent operational characteristics of the element.

When the amorphous silicon substrate is crystallized according to the laser crystallization method such as the ELA method, a substrate that is divided according to applied energy may be visually inspected to establish appropriate energy. However, visual inspection may produce a deviation in the assigned appropriate energy, depending on the inspector, and it requires a skilled inspector. Further, an additional experiment and time consumption for performing an inspection may result in delays and increased process time.

As described above, embodiments may provide a method for crystallizing a silicon substrate, the method including selecting an appropriate laser energy by using an objective index in a laser crystallization method. Thus, according to embodiments the method may obviate deviations between users resulting from errors or inconsistencies in the visual inspection, and may allow for quick and accurate selection of an energy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for crystallizing a silicon substrate, the method comprising:
    manufacturing a crystallized silicon test substrate that is crystallized by scanning excimer laser annealing beams with different energy densities on respective areas of an amorphous silicon test substrate;
    irradiating a surface of the crystallized silicon test substrate using a light source in a visible light wavelength range, and measuring reflectivity corresponding to the respective areas of the crystallized silicon test substrate in the visible light wavelength range;
    extracting average reflectivities of the respective areas of the crystallized silicon test substrate in a plurality of wavelength ranges corresponding to respective colors;
    calculating an optimum energy density (OPED) index for each of the different energy densities by using a value that is acquired by subtracting average reflectivity of red-based colors from average reflectivity of blue-based colors for the respective areas from among the extracted average reflectivities for the respective colors;
    selecting an optimal energy density by comparing the OPED indexes calculated for each of the different energy densities; and
    crystallizing an amorphous silicon substrate using the optimal energy density,
    wherein calculating an OPED index includes calculating the OPED per energy density by applying a different weight value to each average reflectivity per color, and
    in subtracting the average reflectivity of red-based colors from the average reflectivity of blue-based colors, a weight value that is from 1 to 10 is applied to blue and cyan, and a weight value that is from 0.1 to 1 is applied to green, yellow, orange, and red.

2. The method of claim 1, wherein the surface of the crystallized silicon test substrate is irradiated with a visible ray in a wavelength range from 450 nm to 750 nm as a light source.

3. The method of claim 2, wherein a wavelength range of the blue-based colors is 450 nm to 495 nm, and a wavelength range of the red-based colors is 496 nm to 750 nm.

4. The method of claim 3, wherein the blue-based colors include blue having a wavelength range from 450 nm to 475 nm and cyan having a wavelength range from 476 nm to 495 nm.

5. The method of claim 4, wherein the red-based colors include green having a wavelength range from 496 nm to 560 nm, yellow having a wavelength range from 561 nm to 590 nm, orange having a wavelength range from 591 nm to 620 nm, and red having a wavelength range from 621 nm to 750 nm.

6. The method of claim 1, wherein the optimal energy density represents an energy density that is the maximum value from among the OPED indexes calculated for each of the different energy densities.

* * * * *